United States Patent
Cao et al.

(10) Patent No.: US 8,480,354 B2
(45) Date of Patent: Jul. 9, 2013

(54) FAN HOLDER AND HEAT DISSIPATION DEVICE USING THE SAME

(75) Inventors: Lei Cao, Shenzhen (CN); Min Li, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 705 days.

(21) Appl. No.: 12/781,748

(22) Filed: May 17, 2010

(65) Prior Publication Data

US 2011/0146960 A1  Jun. 23, 2011

(30) Foreign Application Priority Data

Dec. 21, 2009  (CN) .......................... 2009 1 0311918

(51) Int. Cl.
  *F04D 29/60* (2006.01)
  *F01D 25/04* (2006.01)

(52) U.S. Cl.
  USPC ..................... 415/119; 415/231.1; 415/214.1; 415/220

(58) Field of Classification Search
  USPC ............................. 415/119, 213.1, 214.1, 220
  See application file for complete search history.

(56) References Cited

U.S. PATENT DOCUMENTS

| | | | | |
|---|---|---|---|---|
| 6,497,273 | B1 * | 12/2002 | Horng et al. ................. | 165/80.3 |
| 7,289,330 | B2 * | 10/2007 | Lu et al. ........................ | 361/710 |
| 7,414,839 | B2 * | 8/2008 | Yu et al. ..................... | 415/213.1 |
| 7,430,122 | B2 * | 9/2008 | Li .................................. | 411/41 |
| 7,742,301 | B2 * | 6/2010 | Li et al. ......................... | 361/697 |
| 7,808,790 | B2 * | 10/2010 | Lin ................................ | 361/719 |
| 8,245,766 | B2 * | 8/2012 | Cao et al. ...................... | 165/121 |
| 2004/0000398 | A1 * | 1/2004 | Lee et al. ...................... | 165/185 |
| 2008/0106869 | A1 * | 5/2008 | Li ................................ | 361/704 |
| 2008/0156458 | A1 * | 7/2008 | Li et al. ........................ | 165/80.3 |
| 2010/0314080 | A1 * | 12/2010 | Cao et al. ...................... | 165/121 |

* cited by examiner

*Primary Examiner* — Igor Kershteyn
(74) *Attorney, Agent, or Firm* — Altis Law Group, Inc.

(57) ABSTRACT

A fan holder adapted for fixing a fan onto a heat sink includes a frame, a fastener pivotedly connected with the frame, and a first resilient member disposed between the frame and the fastener. When the fastener is located at a first position, the first resilient member exerts a resilient force on and keeps the fastener at the first position, and the fan is sandwiched between the fastener and the frame. When an external force is applied on the fastener, the fastener rotates from the first position to a second position in which the fan can no longer be sandwiched between the fastener and the frame, and when the external force is removed, the first resilient member drives the fastener from the second position back to the first position.

15 Claims, 7 Drawing Sheets

FAN HOLDER AND HEAT DISSIPATION DEVICE USING THE SAME

BACKGROUND

1. Technical Field

The disclosure relates to a fan holder capable of conveniently fixing a fan on or detaching the fan from a heat sink, and a heat dissipation device using the fan holder.

2. Description of Related Art

Nowadays, numerous kinds of heat dissipation devices are used to dissipate heat generated by electronic devices. Generally, a heat dissipation device includes a heat sink and a fan. The fan is fastened on the heat sink via a plurality of screws serving as fasteners. Typically, a tool such as a screwdriver is required for this. It is very inconvenient and time-consuming to mount the fan on the heat sink through the screws. Furthermore, the fan occasionally needs to be disassembled from the heat sink for maintenance or replacing with another new fan after the fan has been in service for a long time. In disassembly, since the fan is fastened to the heat sink via the screws, a tool (i.e., a screwdriver) is required to detach the screws from the heat sink. Thus, it is inconvenient to disassemble the fan from the heat sink.

What is needed, therefore, is a fan holder and a heat dissipation device using the fan holder which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
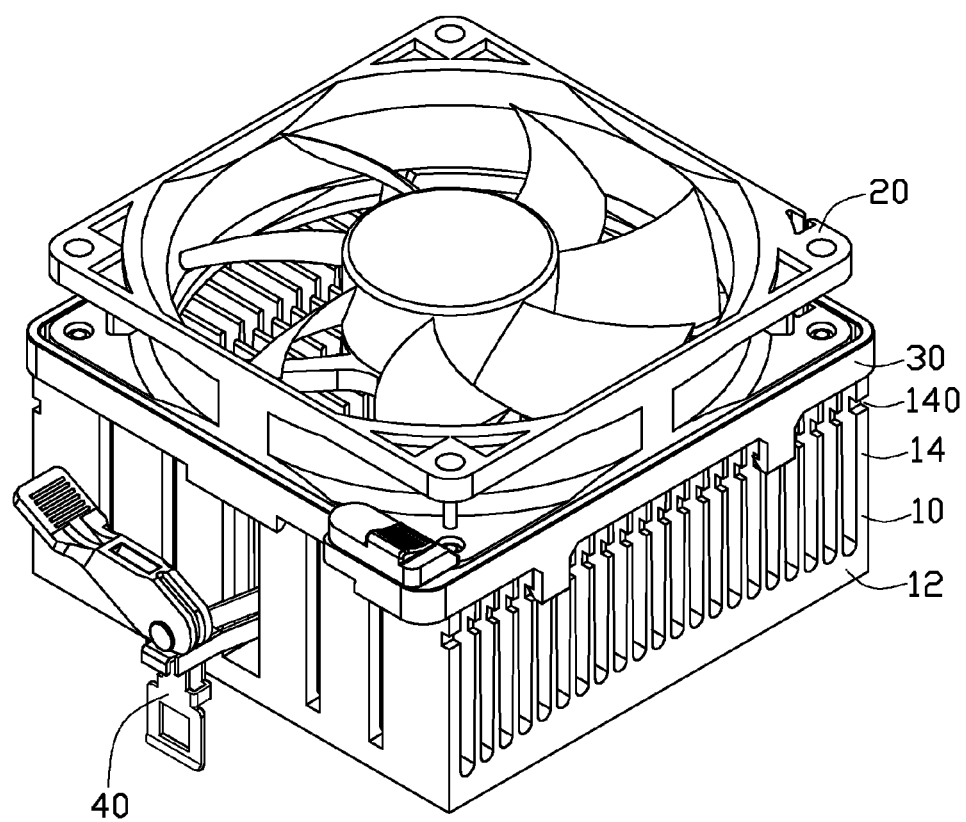
FIGS. 1-2 are isometric, assembled views of a heat dissipation device in accordance with one embodiment of the disclosure, seen from different viewpoints.
Figure 2:
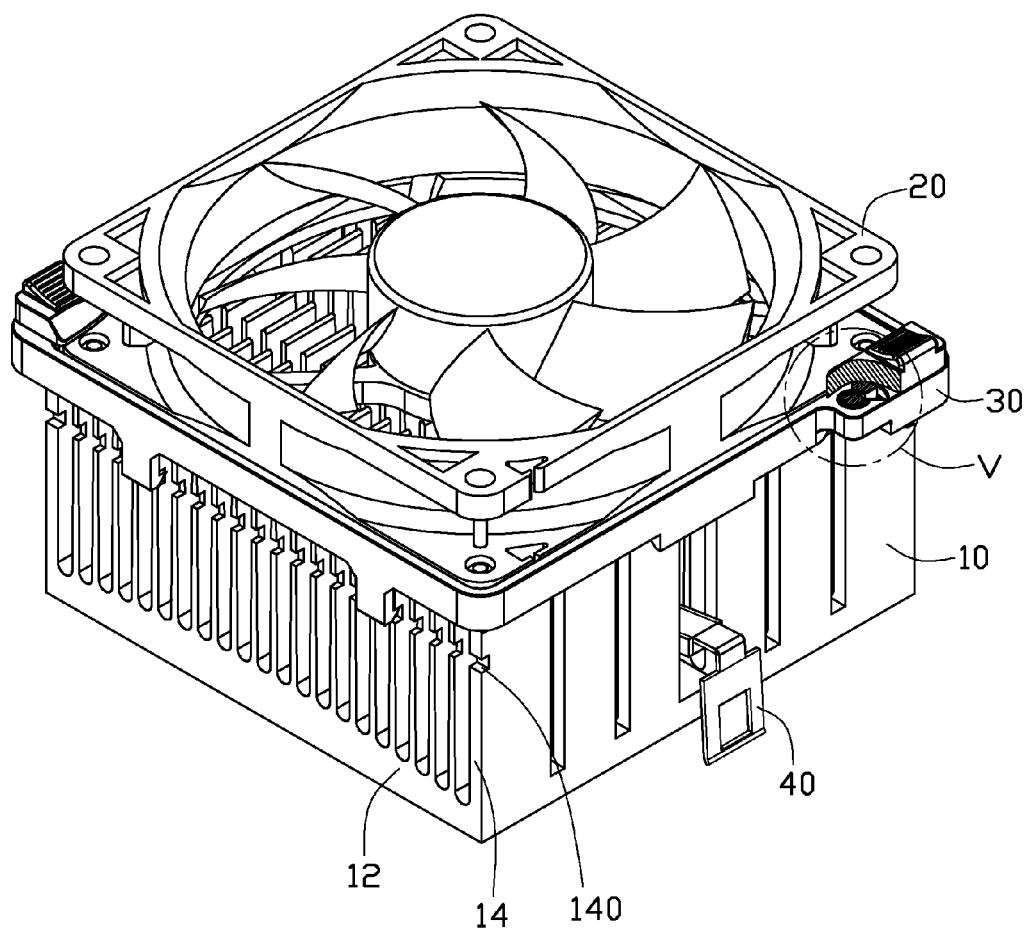

Referring to FIGS. 1-2, a heat dissipation device in accordance with an embodiment of the disclosure is provided for cooling an electronic device (not shown) mounted on a printed circuit board (not shown). The heat dissipation device comprises a heat sink 10, a fan 20 placed above the heat sink 10, a fan holder 30 fixing the fan 20 on the heat sink 10, and a clip 40 extending across the heat sink 10 for mounting the heat dissipation device on the printed circuit board.

The heat sink 10 is integrally made of metal such as aluminum, copper or an alloy thereof. The heat sink 10 includes a heat conducting plate 12, and a plurality of fins 14 upwardly extending from a top face of the heat conducting plate 12. The fins 14 are parallel with each other and arranged on the top face of the heat conducting plate 12 in a matrix. Top ends of the fins 14 at two opposite sides of the heat sink 10 define two longitudinal locking grooves 140 therein, respectively.

Figure 3:
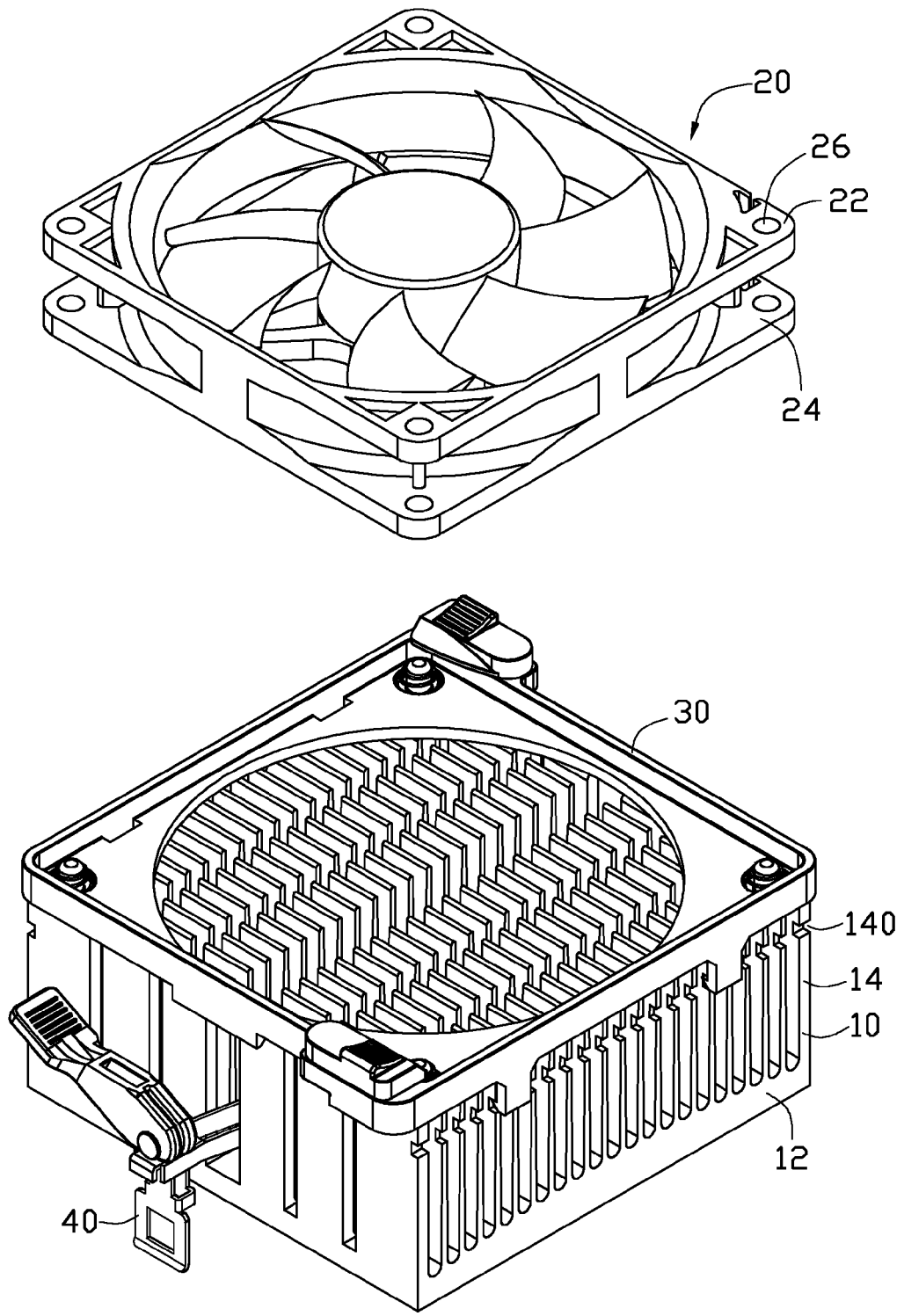
FIGS. 3-4 are partial and more fully exploded views of the heat dissipation device of FIG. 1, respectively.

Also referring to FIG. 3, the fan 20 is generally rectangular in shape, and includes an upper flange 22 and a lower flange 24 parallel to the upper flange 22. Each of the upper and lower flanges 22, 24 defines four through holes 26 in four corners thereof.

Figure 4:
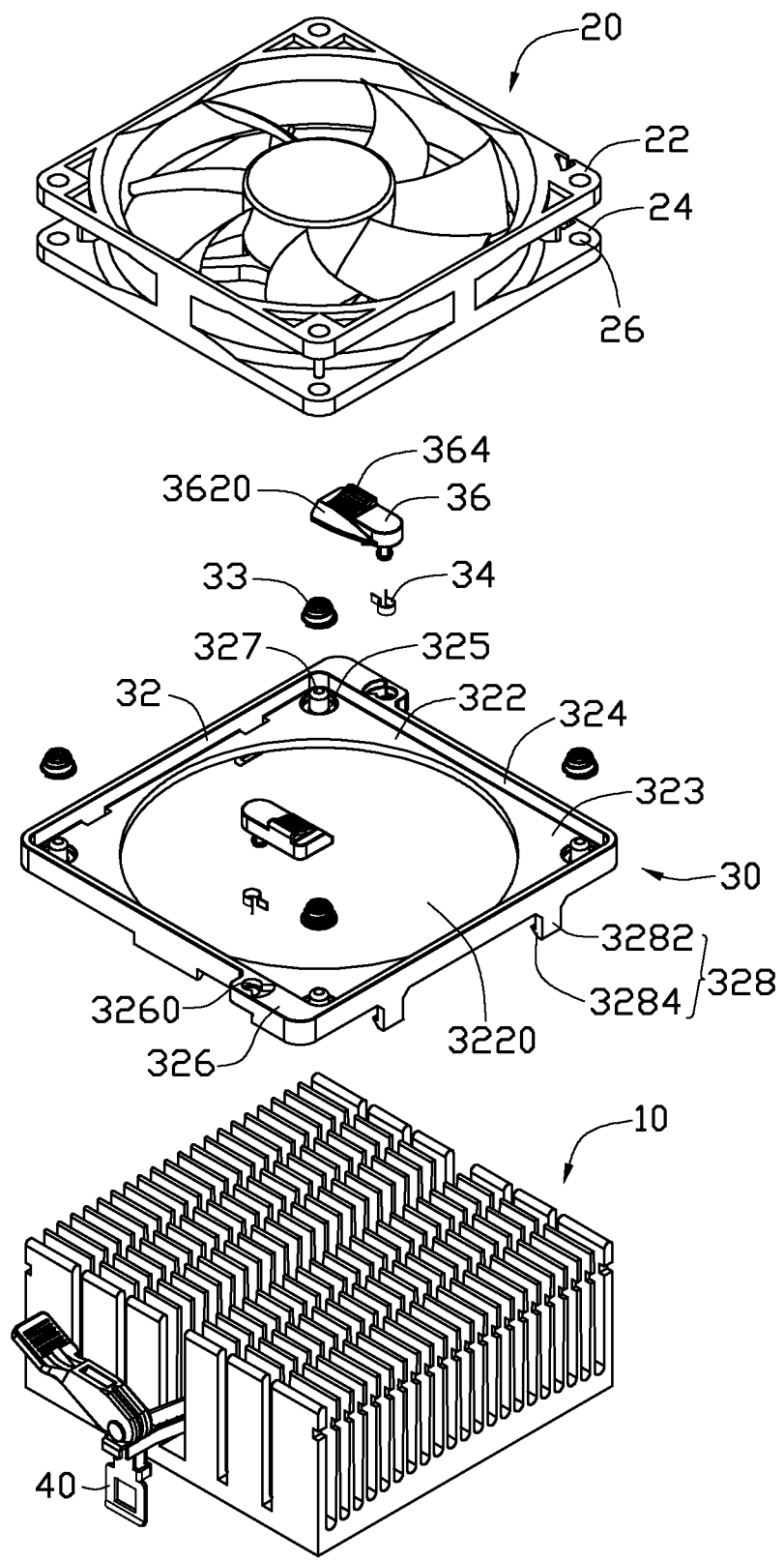

Also referring to FIG. 4, the fan holder 30 includes a substantially rectangular frame 32, two fasteners 36 connecting respectively to two diagonal corners of the frame 32, two first resilient members 34 each disposed between the frame 32 and a corresponding fastener 36, and four second resilient members 33 disposed in four corners of the frame 32. In this embodiment, the first resilient members 34 are elastic bent plates, and the second resilient members 33 are coil springs. Considered another way, the first resilient members 34 are keyhole-shaped compression springs.

Figure 6:
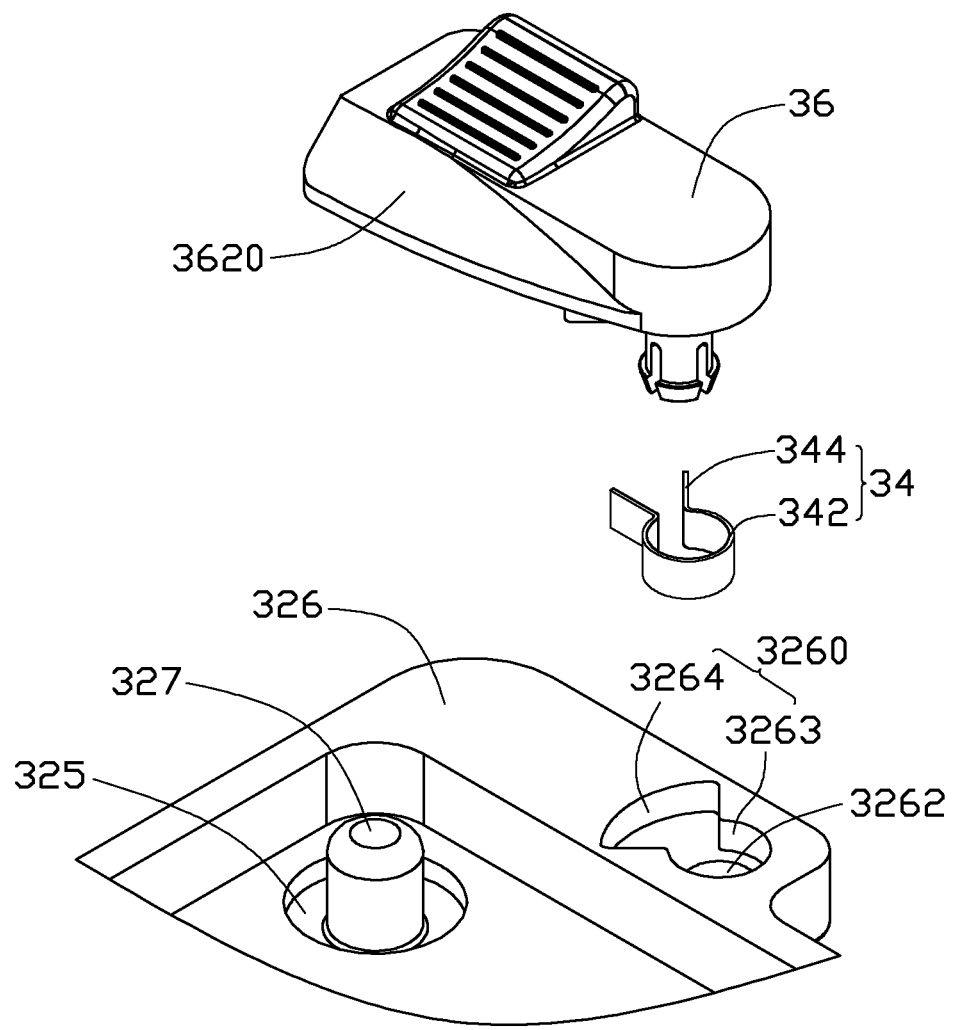
FIG. 6 is an enlarged view of parts of a fan holder of the heat dissipation device shown in FIG. 4, such parts including a fastener.

Also referring to FIG. 6, the frame 32 is integrally made of material such as plastic, and includes a supporting plate 322 and a side wall 324 extending vertically and upwardly from an outer periphery of the supporting plate 322. The supporting plate 322 and the side wall 324 together form a receiving space 323 in the frame 32 for receiving the lower flange 24 of the fan 20 therein. The supporting plate 322 defines a circular through hole 3220 in a center thereof for allowing airflow generated from the fan 20 to pass therethrough. Four circular locating grooves 325 are defined in the four top corners of the supporting plate 322. A locating post 327 protrudes upwardly from a center of each locating groove 325, corresponding to a respective through hole 26 of the lower flange 24 of the fan 20. Two spaced, elastic clasps 328 extend vertically downwardly from each of two opposite sides of a bottom of the supporting plate 322, corresponding to the locking grooves 140 of the heat sink 10. Each clasp 328 includes an elastic arm 3282, and a hook 3284 extending inwardly from a distal end of the arm 3282. Two mounting portions 326 extend horizontally and outwardly from the two diagonal corners of the frame 32. Each mounting portion 326 defines a mounting groove 3260 therein. The mounting groove 3260 includes a first circular portion 3263, and a second truncated sector-shaped portion 3264 communicating with the circular portion 3263. A through hole 3262 is defined through the mounting portion 326 at a center of the circular portion 3263.

Each coil spring 33 is received in a corresponding locating groove 325 of the frame 32, and surrounds the locating post 327 in the locating groove 325. The coil spring 33 is tapered. A diameter of a bottom end of the coil spring 33 is slightly larger than an inner diameter of the locating groove 325 of the frame 32, so that the bottom end of the coil spring 33 can interferentially fit in the locating groove 325 of the frame 32. A diameter of a top end of the coil spring 33 is larger than that of the corresponding through hole 26 of the lower flange 24 of the fan 20.

Figure 5:
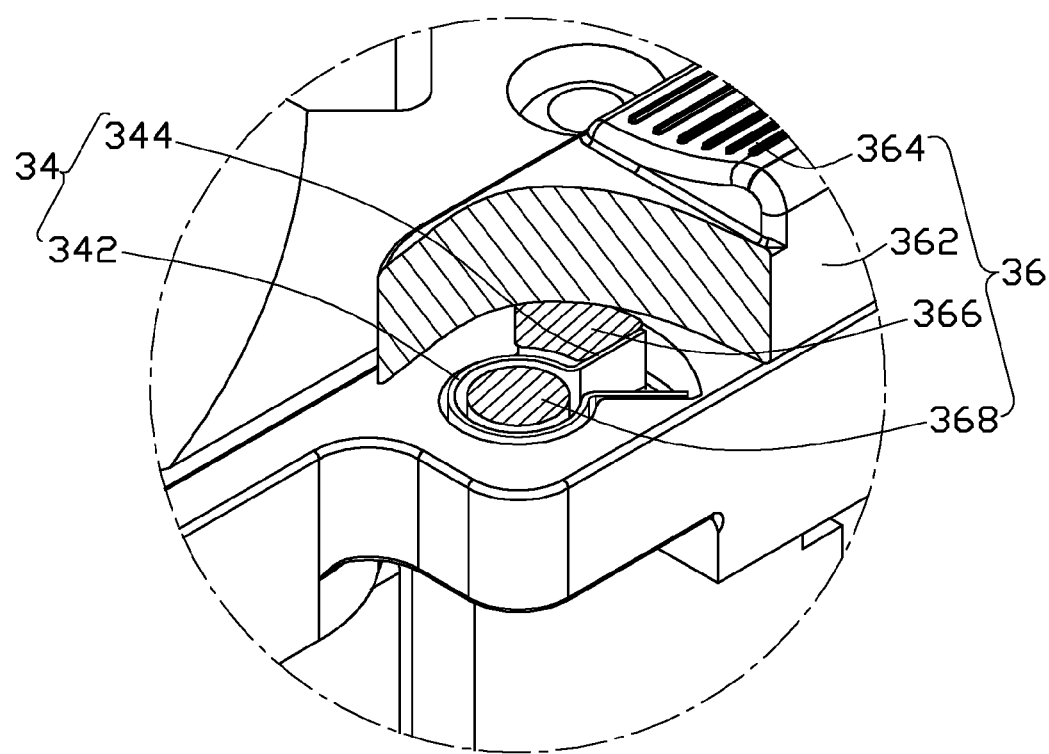
FIG. 5 is an enlarged view of a portion V of the heat dissipation device of FIG. 2, showing some parts cut away.

Also referring to FIG. 5, the elastic bent plates 34 are received in the mounting grooves 3260 of the frame 32. Each elastic bent plate 34 includes a C-shaped deforming portion 342, and two pressing portions 344 extending from two ends of the deforming portion 342. The deforming portion 342 is received in the first circular portion 3263 of the corresponding mounting groove 3260 of the frame 342, and the two pressing portions 344 are received in the second sector-shaped portion 3264 of the mounting groove 3260 of the frame 342.

Figure 7:
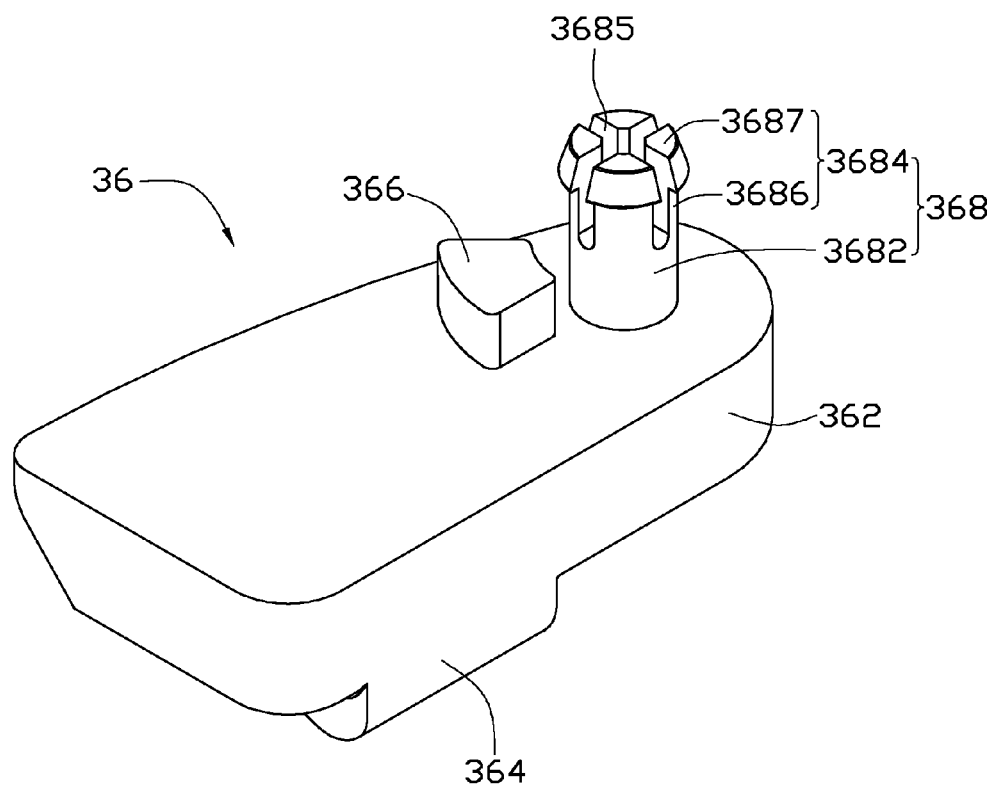
FIG. 7 is an inverted, enlarged view of the fastener of FIG. 6.

Also referring to FIG. 7, each fastener 36 includes a block 362, an operating portion 364 extending upwardly from a top face of the block 362, and a truncated sector-shaped protrusion 366 and a generally cylindrical connecting portion 368 both protruding downwardly from a bottom face of the block 362. A sloping surface 3620 is formed at a lateral side of the block 362, the sloping surface 3620 facing generally towards the inner side of the frame 32. A top side of the operating portion 364 slopes downwards towards the sloping surface 3620. The top side of the operating portion 364 is knurled or grooved to facilitate frictional contact with a user's fingertip. The connecting portion 368 includes a cylindrical base post 3682, and a buckle 3684 formed at a bottom end of the base post 3682. The connecting portion 368 defines two perpendicularly intersecting slots 3685 through the buckle 3684, thereby dividing the buckle 3684 into four spaced locking parts. Each locking part includes an elastically deformable arm 3686 extending down from the bottom end of the base post 3682, and an enlarged head 3687 extending from a bottom end of the arm 3686. The four heads 3687 of the four locking parts cooperatively form a generally plug-shaped (or stopper-shaped) configuration.

When the connecting portion 368 of each fastener 36 is extended downwardly through the through hole 3262 of the corresponding mounting groove 3260 of the frame 32, the buckle 3684 of the connecting portion 368 is forced by an inner wall of the through hole 3262 to elastically deform radially inwardly, thereby closing the slots 3685. After the heads 3687 of the buckle 3864 have completely passed through the through hole 3262, the buckle 3864 elastically rebounds to its original state and the heads 3687 are buckled on a bottom face of the mounting portion 326. Thereby, the fastener 36 is pivotally coupled to the frame 32 at the connecting portion 368, and the fastener 36 can pivot on the base post 3682 of the connecting portion 368 in the through hole 3262.

Referring back to FIG. 5, the deforming portion 342 of each elastic bent plate 34 is received in the first circular portion 3263 of the corresponding mounting groove 3260, and surrounds the base post 3682 of the connecting portion 368 of the corresponding fastener 36. The protrusion 366 of the fastener 36 is received in an inner side of the second sector-shaped portion 3264 of the mounting groove 3260, while the pressing portions 344 of the elastic bent plate 34 are received in an outer side of the second sector-shaped portion 3264 of the mounting groove 3260. Put another way, the protrusion 366 of the fastener 36 and the pressing portions 344 of the elastic bent plate 34 are together received in the second sector-shaped portion 3264 of the mounting groove 3260, with the protrusion 366 of the fastener 36 located nearer to the side wall 324 of the frame 32 than the pressing portions 344 of the elastic bent plate 34. In one embodiment, an inner one of the two pressing portions 344 of the elastic bent plate 34 elastically abuts an outer lateral side of the protrusion 366 of the fastener 36.

In assembly, the clasps 328 of the frame 32 are clasped in the locking grooves 140 of the heat sink 10 to fix the fan holder 30 on the heat sink 10. The fan 20 is pushed downwardly towards the frame 32, so that the lower flange 24 of the fan 20 is received in the receiving space 323 of the frame 32, and the locating posts 327 of the frame 32 extend in the locating holes 26 of the lower flange 24 of the fan 20. In this process, the lower flange 24 of the fan 20 downwardly pushes the sloping surfaces 3620 of the blocks 362 of the fasteners 36 to cause the fasteners 36 to pivot outwards on the base posts 3682 of the connecting portions 368 relative to the frame 32 from original first positions to second positions.

In the first position, the pressing portions 344 of each elastic bent plate 34 are received in the second sector-shaped portion 3264 of the mounting groove 3260, with a largest gap defined between the two pressing portions 344 of the elastic bent plate 34. In one embodiment, the inmost pressing portion 344 of each elastic bent plate 34 exerts a slight resilient force on the protrusion 366 of the corresponding fastener 36, to keep the fastener 36 at the first position. As the fastener 36 rotates from the first position to the second position, the inner pressing portion 344 of the elastic bent plate 34 is elastically pushed outwardly by the protrusion 366 of the fastener 36 towards the outer pressing portion 344 of the elastic bent plate 34. Thus, in the second position, the inner pressing portion 344 of the elastic bent plate 34 is elastically deformed towards the outer pressing portion 344 of the elastic bent plate 34, with a smallest gap defined between the two pressing portions 344 of the elastic bent plate 34.

When the lower flange 24 of the fan 20 is completely received in the receiving space 323 of the frame 32, the lower flange 24 no longer contacts the sloping surface 3620 of the block 362 of each fastener 36, and so there is no longer any force acting on the sloping surface 3620 of the fastener 36. The inner pressing portion 344 of the elastic bent plate 34 rebounds and pushes the protrusion 366 of the fastener 36 towards the side wall 324 of the frame 32, and the fastener 36 rotates from the second position back to the first position. In the first position, the bottom face of the block 362 abuts the top face of the lower flange 24 of the fan 20, so that the lower flange 24 of the fan 20 is sandwiched between the supporting plate 322 of the frame 32 and the blocks 362 of the fasteners 36. Simultaneously, the coil springs 33 in the locating grooves 325 of the frame 32 are compressed and exert an upward resilient force on the bottom face of the lower flange 24 of the fan 20, so that the fan 20 is firmly fastened to the frame 32 by the fasteners 36, and vibration and noise generated by the fan 20 are thereby reduced.

Disassembly of the fan 20 from the fan holder 30 of the heat dissipation device can be readily performed. A user can turn the operating portion 364 of each fastener 36 to cause the fastener 36 to pivot outwardly on the connecting portion 368. Thus, the fastener 36 is caused to pivot from the first position to the second position. That is, the operating portions 364 of the fasteners 36 are turned outwards to cause the blocks 362 of the fasteners 36 to disengage from the lower flange 24 of the fan 20. Then, the fan 20 is automatically pushed to move upwardly by the coil springs 33. Thus, the fan 20 can be detached from the fan holder 30.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A fan holder adapted for fixing a fan onto a heat sink, the fan holder comprising:
   a frame;
   a fastener pivotedly connected with the frame; and
   a first resilient member disposed between the frame and the fastener;
   wherein when the fastener is located at a first position, the first resilient member exerts a resilient force on and keeps the fastener at the first position, and the fastener and the frame cooperatively define a space therebetween, the space configured for receiving a portion of the fan therein such that the portion of the fan is sandwiched between the fastener and the frame; and
   when an external force larger than the resilient force is applied on the fastener in a direction opposite to the resilient force, the fastener rotates from the first position to a second position in which the portion of the fan can no longer be sandwiched between the fastener and the frame and the first resilient member is elastically deformed, and when the external force is removed, the first resilient member rebounds and drives the fastener from the second position back to the first position.

2. The fan holder of claim 1, wherein the frame comprises a supporting plate and a mounting portion at a side of the supporting plate, the fastener comprising a block, and a protrusion and a connecting portion both protruding from a bottom face of the block, the protrusion being movably received in the mounting portion of the frame, the connecting portion pivotedly connected with the mounting portion, and the first resilient member being received in the mounting portion and elastically contacting the protrusion of the fastener.

3. The fan holder of claim 2, further comprising a plurality of second resilient members, the supporting plate of the frame defining a plurality of locating grooves, the locating grooves receiving the second resilient members therein, wherein each of the second resilient members interferentially fits in a corresponding locating groove.

4. The fan holder of claim 3, wherein each locating groove has a locating post protruding upwardly from a center thereof, a corresponding second resilient member surrounding the locating post.

5. The fan holder of claim 2, wherein an operating portion extends upwardly from a top of the block of the fastener, and a top side of the operating portion slopes downwards towards an inner side of the frame.

6. The fan holder of claim 2, wherein the mounting portion defines a groove therein, the groove comprising a first circular part and a second truncated sector-shaped part communicating with the circular part, the first resilient member comprising a C-shaped deforming portion and two pressing portions extending from two ends of the deforming portion, the deforming portion being received in the first circular part of the groove and surrounding the connecting portion of the fastener, the pressing portions and the protrusion of the fastener being movably received in the second truncated sector-shaped part of the groove.

7. The fan holder of claim 6, wherein the mounting portion has a through hole defined therein, the through hole being located at a center of the circular part of the groove of the mounting portion, the connecting portion comprising a base post and an enlarged buckle formed at a bottom end of the base post, the connecting portion defining two intersecting slots through the buckle, thereby dividing the buckle into four spaced locking parts, the buckle extending through the through hole of the mounting portion and buckled on the mounting portion.

8. The fan holder of claim 2, wherein the frame further comprises a side wall extending upwardly from an outer periphery of the supporting plate, the supporting plate and the side wall cooperatively forming a receiving space, the receiving space being adapted for receiving a part of the fan therein, said part including the portion of the fan.

9. The fan holder of claim 2, wherein the block of the fastener has a sloping surface formed at a side thereof facing generally towards an inner side of the frame, and the sloping surface is adapted to facilitate frictional contact with a user's fingertip which applies the external force.

10. A heat dissipation device, comprising:
a heat sink;
a fan; and
a fan holder fixing the fan on the heat sink, the fan holder comprising:
a frame;
a fastener pivotedly connected to the frame; and
a first resilient member disposed between the frame and the fastener;
wherein when the fastener is located at a first position, the fastener and the frame cooperatively sandwiching a portion of the fan therebetween, with the first resilient member exerting a resilient force on and keeping the fastener at the first position; and
when an external force larger than the resilient force is applied on the fastener in a direction opposite to the resilient force, the fastener rotates from the first position to a second position in which the portion of the fan is no longer sandwiched between the fastener and the frame and the first resilient member is elastically deformed, and when the external force is removed, the first resilient member rebounds and drives the fastener from the second position back to the first position.

11. The heat dissipation device of claim 10, wherein the frame comprises a supporting plate and a mounting portion at a side of the supporting plate, the fastener comprising a block, and a protrusion and a connecting portion both protruding from a bottom face of the block, the protrusion being movably received in the mounting portion of the frame, the connecting portion pivotedly connected with the mounting portion, and the first resilient member being received in the mounting portion and elastically contacting the protrusion of the fastener, the fan being sandwiched between the block of the fastener and the supporting plate of the frame.

12. The heat dissipation device of claim 11, wherein the fan holder further comprises a plurality of second resilient members, the supporting plate of the frame defining a plurality of locating grooves, the locating grooves receiving the second resilient members therein, wherein a bottom end of each second resilient member interferentially fits in a corresponding locating groove, and a top end of each second resilient member abuts against the fan.

13. The heat dissipation device of claim 11, wherein the frame further comprises a side wall extending upwardly from an outer periphery of the supporting plate, the supporting plate and the side wall cooperatively forming a receiving space, the receiving groove receiving a part of the fan therein, said part including the portion of the fan.

14. The heat dissipation device of claim 11, wherein the block of the fastener has a sloping surface formed at a side thereof facing generally towards an inner side of the frame, and the sloping surface is adapted to facilitate frictional contact with a user's fingertip which applies the external force.

15. The heat dissipation device of claim 11, wherein the mounting portion defines a groove therein, the groove comprising a first circular part and a second truncated sector-shaped part communicating with the circular part, the first resilient member comprising a C-shaped deforming portion and two pressing portions extending from two ends of the deforming portion, the deforming portion being received in the first circular part of the groove and surrounding the connecting portion of the fastener, the pressing portions and the protrusion of the fastener being movably received in the second truncated sector-shaped part of the groove.

* * * * *